United States Patent [19]
Knirck et al.

[11] Patent Number: 6,031,597
[45] Date of Patent: Feb. 29, 2000

[54] METHOD AND APPARATUS FOR TRANSFER OF A RETICLE PATTERN ONTO A SUBSTRATE BY SCANNING

[76] Inventors: Jeffrey G. Knirck, 868 Jasmine Dr., Sunnyvale, Calif. 94086; Paul A. Swanson, 3585 Millet Ct., San Jose, Calif. 95014

[21] Appl. No.: 08/950,237

[22] Filed: Oct. 14, 1997

Related U.S. Application Data

[60] Provisional application No. 60/028,644, Oct. 15, 1996.

[51] Int. Cl.[7] .................................................. G03B 27/42
[52] U.S. Cl. ............................ 355/53; 355/67; 356/399; 356/400; 356/401
[58] Field of Search ................ 355/53, 67; 356/399–401

[56] References Cited

U.S. PATENT DOCUMENTS

| | | | |
|---|---|---|---|
| 5,298,939 | 3/1994 | Swanson et al. | 355/53 |
| 5,495,279 | 2/1996 | Sandstrom | 347/258 |
| 5,617,182 | 4/1997 | Wakamoto et al. | 355/53 |
| 5,659,383 | 8/1997 | Ozawa | 355/53 |
| 5,677,754 | 10/1997 | Makinouchi . | |
| 5,726,739 | 3/1998 | Hayata | 355/67 |
| 5,781,277 | 7/1998 | Iwamoto | 355/53 |
| 5,822,043 | 10/1998 | Ebinuma | 355/55 |

Primary Examiner—Georgia Epps
Assistant Examiner—Timothy J. Thompson
Attorney, Agent, or Firm—Townsend and Townsend and Crew LLP

[57] ABSTRACT

A system and method for reproducing isolated images over an entire substrate, by creating multiple adjacent scanned strips of whole images using a unity magnification scanning photolithographic system.

17 Claims, 3 Drawing Sheets

METHOD AND APPARATUS FOR TRANSFER OF A RETICLE PATTERN ONTO A SUBSTRATE BY SCANNING

This application claims benefit of Provisional Appln. 60/028,644 filed Oct. 15, 1996.

BACKGROUND OF THE INVENTION

The present invention relates to the field of photolithographic techniques. More specifically, one embodiment of the invention provides an improved lithographic method that is optimized for fabricating Thin Film Heads (TFH), Charge Coupled Devices (CCD), moderate resolution semiconductors, and any other electronic circuit or images whose smallest field dimension can be practically relayed by a lens system and whose second dimension may be significantly larger than the lens system. Still more specifically, the present invention relates to a manufacturing method and apparatus wherein an image from a photomask or a reticle (hereafter called a reticle) is imaged onto a photosensitive substrate by multiple passes of one dimensional scanning means.

Currently, there are three types of machines used for printing micron size images on moderate to large substrates in the manufacture of electronic devices like flat panel displays, semiconductors, and multi-chip modules. The first type of machine is called a contact or proximity printer. This is the oldest type of machine. In a contact printer, the reticle and substrate are in contact or close proximity and are aligned to each other. A flood exposure illuminator illuminates the reticle and thereby exposes the substrate. This machine is relatively low in cost, but has the large disadvantage that reticles are ruined after a certain number of uses, and its use induces frequent defects in the product. Manufacturers who use these machines would like to switch to one of the other two types of machines, except the cost is often prohibitive.

A second type of machine is commonly called a step-and-repeat camera because it moves to a specified location and prints a portion of the photosensitive substrate and then moves to another location and typically prints the same image on that portion of the substrate, repeating the process until the entire substrate is printed. Steppers were developed for integrated circuit fabrication where high resolution features within small repetitive patterns typify the product. Various object to image magnifications are used by different equipment manufacturers. When a stepper is used to expose a pattern larger than its field size onto a substrate, multiple images must be stitched together with high precision to create the desired large product. One major disadvantage of the step-and-repeat technology is the need for very precise alignment to seamlessly stitch adjacent fields together, and a very complex stage with a precise metrology system.

A third type of machine is called a scanner. The largest format scanners print six inch (150 mm) wide image at 1× magnification with resolutions down to about 1 micrometer. The scan is a single axis smooth motion of a substrate under a lens system. The scan can be any length, but the illuminated width is limited to the lens field. The optics are usually designed to cover the width of the substrate. Similarly, the reticle dimensions are slightly greater than the substrate. Hybrid scanners have been built that print two six inch wide images that are aligned adjacent to each other like steppers do.

The steppers and scanners, particularly those made for moderate to large substrate lithography, are complex, expensive, and very large, consuming area of expensive clean room floor space due to their large substrate stages. The stage blind stepping performance requires high precision alignment as well as complex and expensive metrology.

From the above information it is seen that an improved system and method for printing moderate resolution images on moderate to large substrates is needed.

SUMMARY OF THE INVENTION

An improved system and method for performing the photolithographic exposure process on moderate to large substrates is provided by virtue of the present invention. The invention provides a means to expose a moderate to large substrate by transferring an image from a reticle object to an image substrate without the complexity and expense of prior art systems.

According to one aspect of the invention, an erect or non-inverted unity magnification relay optical system (here after referred to simply as "the relay optical system") is provided to transfer the image of the mask onto the substrate.

According to a preferred embodiment of the present invention, the transfer process is limited in one axis to an integer number of complete circuits or images that can be contained within the relay optical system.

According to a preferred embodiment of the present invention, an erect or non-inverted axis of the relay optical system is parallel to the scan axis.

According to a preferred embodiment of the present invention, a dimension of the reticle in the axis parallel to the scan axis is unlimited but usually designed to be slightly larger than a dimension of the substrate.

According to a preferred embodiment of the present invention, in one mode, the mask is opaque beyond the circuit or image width dimension and is used primarily as a possible means to create an exposure boundary in that dimension, and defines the minimum index step size that will prevent the film from being double-exposed.

According to a preferred embodiment of the present invention, the reticle may be shifted relative to the substrate along the scan axis by an amount that is slightly greater than one half the largest dimension of the circuit or image, along the scan axis, thus providing for the ability to more greatly pack images into non-rectangular substrates, such as wafers.

According to a preferred embodiment of the present invention, the exposure illumination source provides a uniform source of actinic light whose field dimensions are maximally the same as the lens field, but adjustable such that the illuminated field width is just slightly wider than the narrowest of the circuit or image and, thus, capable of expanding in the second dimension and increasing effective illumination power.

According to a preferred embodiment of the present invention, during the index period the illuminator, reticle, reticle chuck, and lens are in motion relative to the substrate and, more specifically, motion perpendicular to the scan axis and by an amount that is equal to or, slightly, greater than the width of the circuit or image, and when needed, with a combined resolution and precision significantly greater than the required overlay tolerance needed between the substrate image and the image being transferred.

According to a preferred embodiment of the present invention, during the scan period the illuminator and lens are in motion relative to the balance of elements in the system and, more specifically, at a regulated velocity.

According to a preferred embodiment of the present invention, a sensor is attached to the lens housing that measures the relative distance between the reticle and substrate to a resolution that is a small part of the depth-of-focus of the lens.

According to a preferred embodiment of the present invention, a substrate chuck is provided to control the position and flatness of the substrate during the printing process.

According to a preferred embodiment of the present invention, an alignment detector is provided that allows a complete scan image to be aligned to the reticle using nonactinic light prior to exposure.

According to a preferred embodiment of the present invention, a one to three degree of freedom stage is provided that can be used to regulate the distance between the lens and substrate where the number of controls are directly related to the numerical aperture of the lens, width of the circuit or image, and wedge and flatness tolerances of the substrate.

According to a preferred embodiment of the present invention, the architecture includes an automated substrate handling system that provides a means to load or unload substrates from a storage or holding area.

According to a preferred embodiment of the present invention, adjacent scans are independent of one another.

According to a preferred embodiment of the present invention, the reticle used can be manufactured using a reduction stepper and, further, can be manufactured from a specific reduction stepper from which substrates are generated and thus providing an enhanced means to mix-and-match.

According to a preferred embodiment of the present invention, a plurality of illumination sources may be fixed relative to all other elements of the system and direct their illumination sources into a fiber optic that is flexible and terminates at and fills a pupil plane on one side of the reticle. This capability provides a means to significantly reduce the mass if the illumination source is scanned or otherwise in motion.

According to a preferred embodiment of the present invention, the number of whole fields along or across the scan axis can be artificially limited to enhance reticle to substrate registration performance. This mode of operation also requires a mask with a fewer number of images that is, therefore, less expensive to manufacture and, ultimately, less susceptible to particulate exposure.

DESCRIPTION OF SPECIFIC EMBODIMENTS

Figure 1:
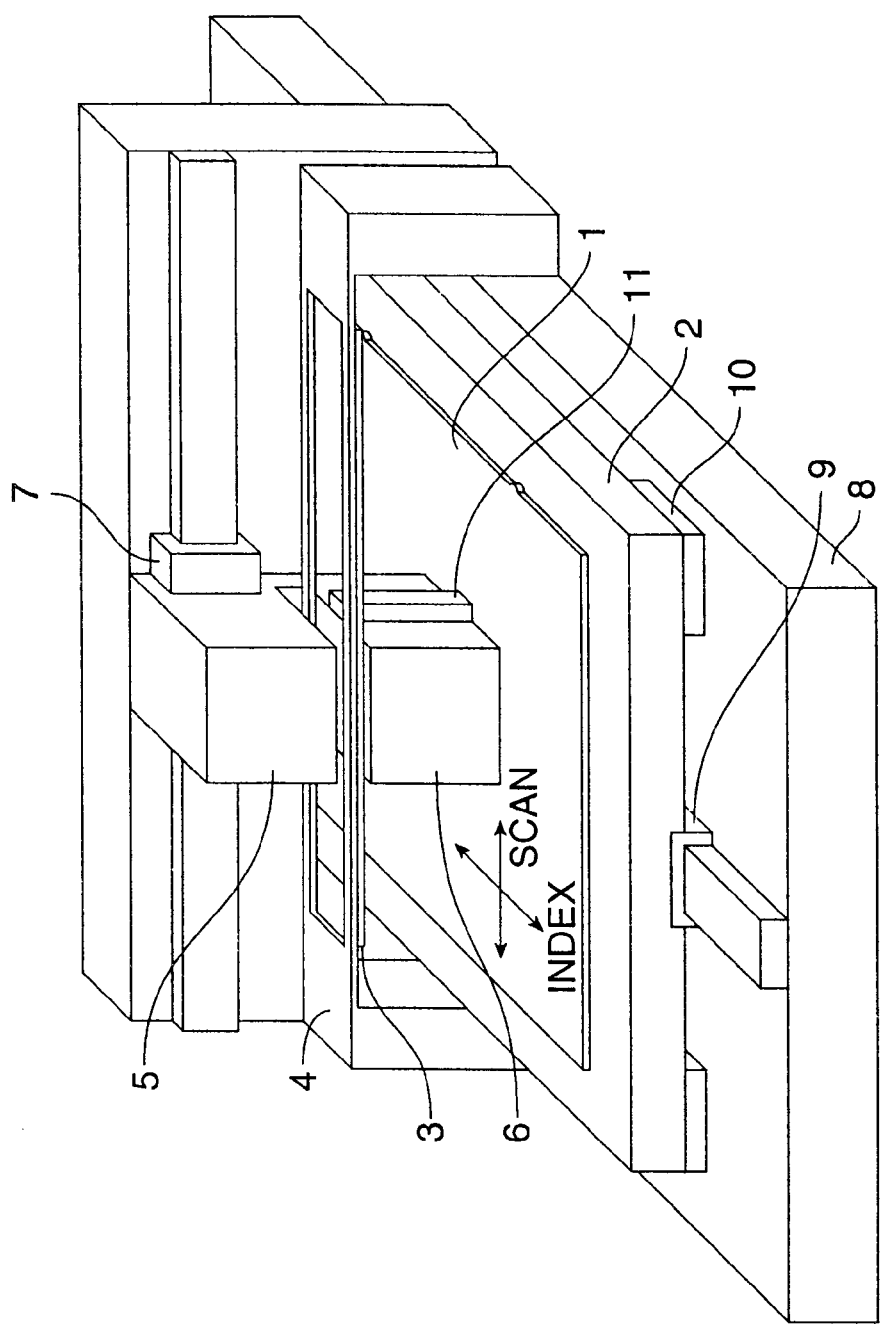
FIG. 1 is an isometric view of and embodiment of the present invention.

FIG. 1 illustrates the essential components of an apparatus of the present invention. The system is constructed on a stable base (8). The substrate (1), such as a semiconductor wafer, coated with a layer of photosensitive material is affixed rigidly on the substrate stage (2). The mask (3), which contains the high resolution pattern that is to be imaged on the substrate (1), is affixed rigidly on the mask chuck (4). The substrate stage (2) is capable of high precision movements, the details of which will be described shortly.

The mask (3) is illuminated by radiation from the illumination system (5). The projection lens assembly (6) is a unity magnification lens system. It collects radiation from the illuminated rectangle shaped effective source plane on the mask and faithfully reproduces the high resolution pattern within the rectangular shaped illuminated region of the mask, onto the substrate (1). The project image is erect, or non-reversed, or both. The projection lens assembly (6) has a numerical aperture that is determined by the resolution requirements of the lithography system.

The projection lens assembly (6) is designed for a large image field and the exposure region on the substrate is defined as a rectangle whose dimension normal to the scan is slightly greater than an even multiple of one of the two image dimensions yet smaller than the lens field diameter and the second dimension of the exposure rectangle is maximized such that the rectangle is just contained within the limits of the lens field. The exposure region could alternatively be any shape that has a uniform length along the scan axis such as a parallelogram.

The substrate stage (2) and reticle (3) are held substantially fixed while the illuminator (5) and its emission plane are scanned at a controlled velocity across the reticle (3) while, at the same time, the projection lens assembly (6) tracks the illuminated shape and relays the illuminated reticle image onto the substrate (1), so as to cover the length of the substrate in the direction of the scan. After completion of the scan across the substrate length, the substrate stage (2) moves the substrate (1) orthogonal to the scan direction and by an amount herein termed "effective scan width." Following such a lateral movement of the substrate, a new scan is generated by the process described above. The effective scan width and the illumination source system are designed with such characteristics that in combination, a seam of unexposed or double-exposed resist is created. The seam's dimension normal to the scan will be herein termed "cross-scan street width." The street width, either in or along the scan axis, is used to provide a boundary between individual circuits or images, and latter a path along which to fracture the substrate into individual circuits without impinging into the circuit.

The above exposure process thus termed "scan and repeat" mechanism, is repeated until the entire substrate is exposed with the desired number of patterns. The details of the scanning, stepping, and repeating movements discussed above will be described presently. A scan motor (7) is functionally coupled to the illumination system (5) and projection lens assembly (6) such that they are propelled in a controlled velocity mode along a non-contaminating air bearing surface. An index motor (9) is functionally coupled to the substrate stage (2) and employs a metrology system, such as a linear encoder, to close the servo to a combined precision and accuracy significantly less than any existing image alignment error tolerance. The illumination system (5) maintains the desired illumination characteristics throughout the exposure of the entire substrate.

A focus and alignment detector (11) is provided to facilitate reticle to substrate focus and alignment. The substrate stage is supported on air bearing feet (10) that can be made to provide the motion required to affect focus.

Figure 2:
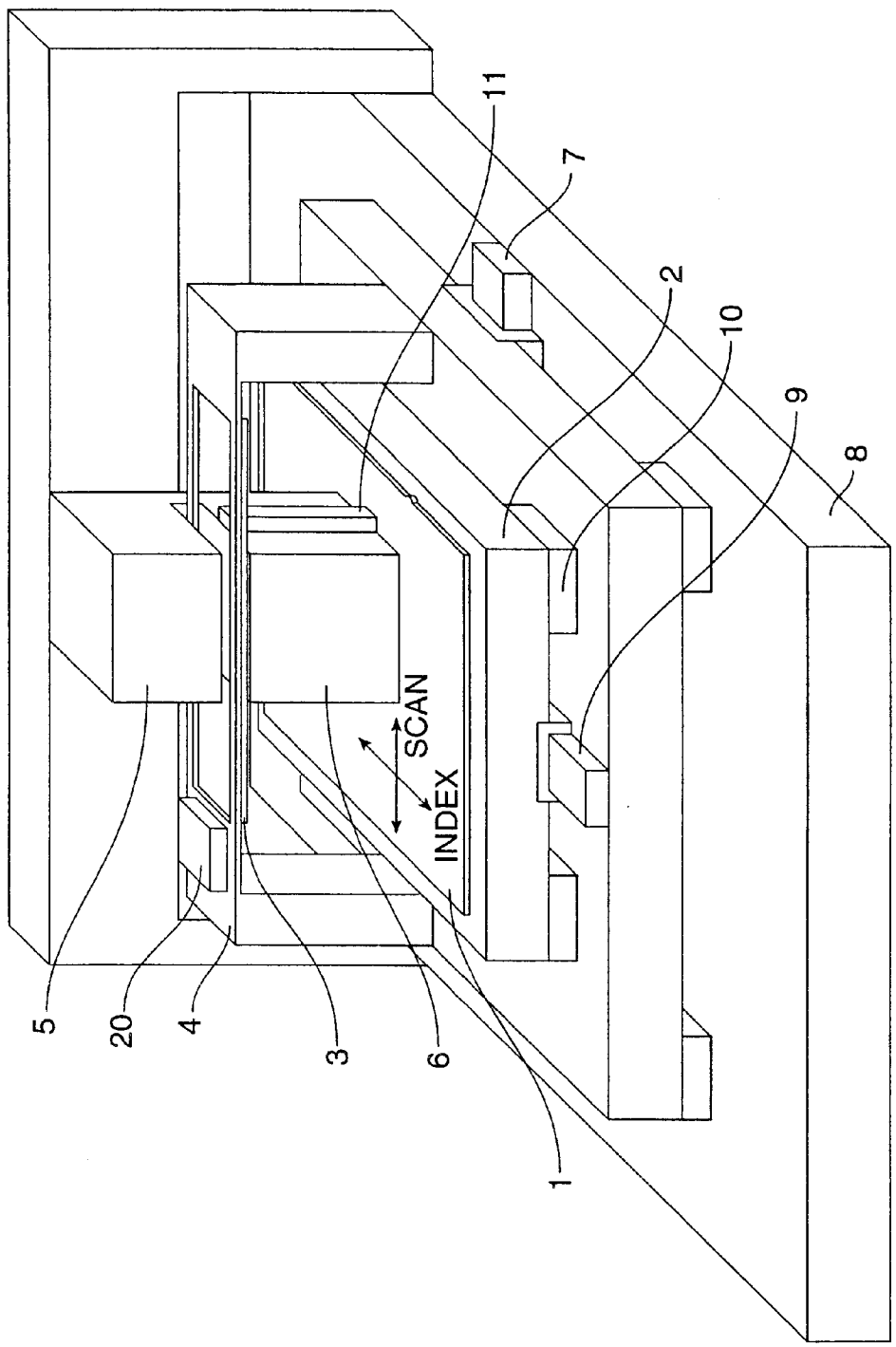
FIG. 2 is an isometric view of an alternative configuration of the invention.

FIG. 2 is an isometric view of an alternative configuration of the invention in which the lens (6) and illuminator (5) are held fixed as the reticle chuck (4) and the substrate stage (2) are moved. FIG. 2 contains all the same components as FIG. 1 except that the scan motor (7) is mounted on a scan stage that moves both the reticle (3) and the substrate (1) in the scan axis.

An actuator capable of small and precise motion is required to align the reticle and substrate to each other in the scan axis. The alignment actuator (20) can move either the reticle or substrate. It can be incorporated in the mask chuck (4) or the substrate stage (2).

In one embodiment, a plurality of illumination sources may be fixed relative to all other elements of the system and direct their illumination sources into a fiber optic that is flexible and terminates at and fills a pupil plane on one side of the reticle. This capability provides a means to significantly reduce the mass if the illumination source is scanned or otherwise in motion.

Figure 3:
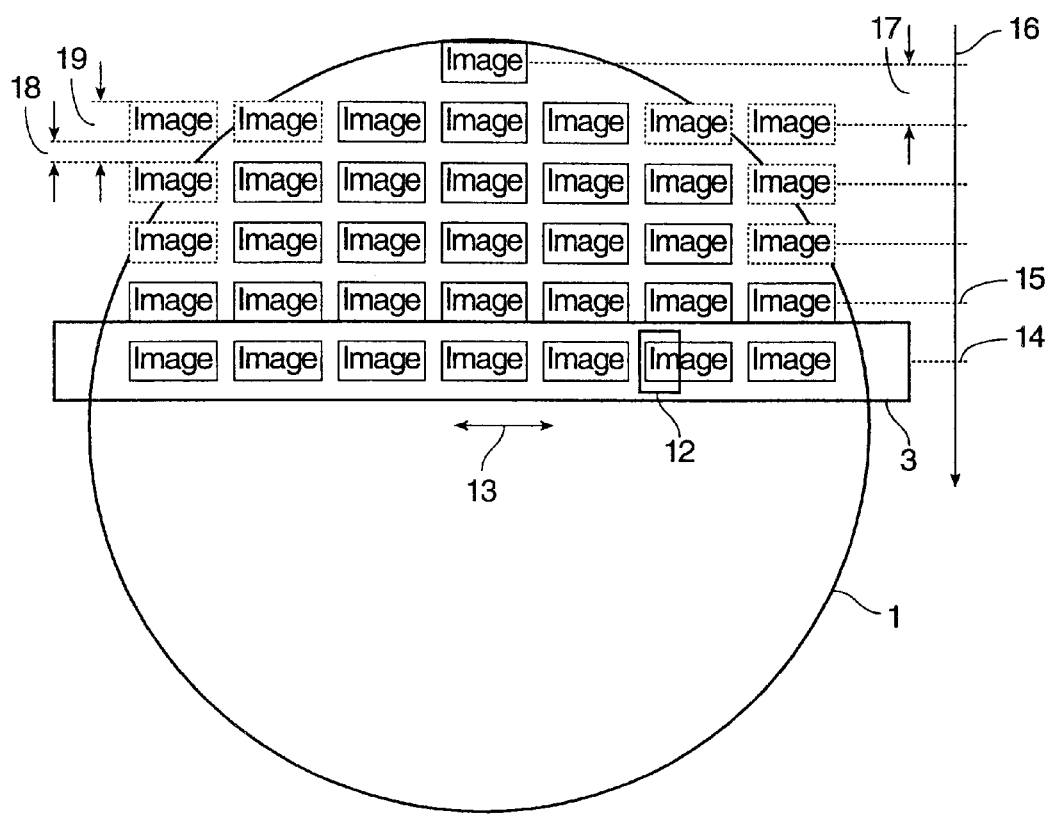
FIG. 3 is a schematic view of the exposure process.

Referring to FIG. 3 we next describe the mechanism of nonoverlapping rectangular scanning. The illuminated region (12) is the area on the reticle and substrate that is illuminated at any given instant in time. The illumination region (12) is scanned over the substrate (1) and reticle (3) in one direction in the scan axis (13). It is important to note that the illumination beam is in motion and, more specifically at a regulated velocity, as is the projection lens assembly. This is shown as a first scan (14).

To generate the next scan (15), first the substrate (1) is moved in the index axis (16), an axis orthogonal to the scan axis (13), by an index distance (17), which is the sum of the width of the illumination region orthogonal to the scan axis and the width of the cross-scan street (18). The width of the illuminated region (12) orthogonal to the scan axis is an integer number of image pitches (19). The next scan (15) is generated by scanning the illumination region (12) across the substrate in the new adjacent position, in a manner identical to the generation of the first scan (14) except the direction.

With this scanning illumination system, the total exposure dose received at any point in the illuminated field is constant and determined by the illumination intensity and scan stage velocity. Further, by design, there is an integer number of fields being exposed in the index axis perpendicular to the scan axis.

The above descriptions are illustrative and not restrictive. Many variations of the invention will become apparent to those skilled in the art upon review of this disclosure. Merely by way of example, different stage types can be used to transport the illuminator, lens, reticle, or substrate. Other configurations of the stages could also be used. Various lens types could be used. A Wynn-Dyson or back-to-back microscope objects could be used. A variety of materials of construction could be used for the various components if chosen carefully. The invention can be mounted in various orientations, and with a variety of physical mounting techniques. The apparatus can incorporate various sensors to facilitate operation or safety. Different operating sequences can also be used to tailor the operation of the invention to a particular application. The scope of the invention should, therefore, be determined not just with reference to the above description, but instead should be determined with reference to the appended claims along with their full scope of equivalents.

What is claimed is:

1. An apparatus for transferring a reticle pattern from a reticle onto a substrate, the apparatus comprising:
    a base;
    a substrate stage coupled to the base for holding the substrate;
    a reticle stage coupled to the base comprising,
        a stage structure;
        a reticle chuck coupled to the stage structure for holding the reticle substantially parallel to the substrate;
        an illumination system disposed adjacent the reticle chuck;
        a unity magnification lens system disposed adjacent the reticle chuck opposite and coupled to the illumination system, the lens system for projecting an image of the reticle pattern onto the substrate; and
        a first actuator coupled to the stage structure and the lens and illumination systems for moving the lens and illumination systems together in a first dimension to effect transfer of the reticle pattern onto the substrate; and
    a second actuator coupled to the base for providing relative motion in a second dimension between the substrate stage and the reticle stage, the second dimension being orthogonal to the first dimension, one of the first dimension and the second dimension being along a single axis;
    wherein the apparatus is operable to transfer multiple, adjacent, non-overlapping copies of the reticle pattern onto the substrate by providing relative motion in the second dimension between the substrate stage and reticle stage to align the reticle pattern with successive, adjacent portions of the substrate, and moving the lens and illumination systems together in the first dimension to transfer the reticle pattern to the substrate.

2. The apparatus of claim 1 wherein the second actuator is coupled to the substrate stage and is operable to provide motion of the substrate stage with respect to the reticle stage, the reticle stage being stationary with respect to the base.

3. The apparatus of claim 1 wherein the first actuator provides substantially constant velocity motion in the first dimension until the reticle pattern is completely transferred to the substrate.

4. The apparatus of claim 1 wherein the unity magnification lens system projects an erect and non-reversed image of the reticle pattern onto the substrate.

5. The apparatus of claim 1 wherein the substrate stage comprises:
    a substrate chuck to which the substrate is secured; and
    at least one focus actuator for providing motion of the substrate in a third dimension, the third dimension being substantially perpendicular to a plane defined by the first and second dimensions.

6. The apparatus of claim 1 wherein the first actuator is operable to move the lens and illumination systems in a third dimension, the third dimension being substantially perpendicular to a plane defined by the first and second dimensions.

7. The apparatus of claim 1 wherein illumination system provides a rectangular illumination field having an aspect ratio which is adjustable.

8. The apparatus of claim 1 further comprising an illumination source coupled to the stage structure for providing light to the illumination system, the illumination source being coupled to the illumination system via a flexible fiber optic transmission line.

9. The apparatus of claim 1 further comprising a sensor coupled to the lens system for measuring a distance between the reticle and the substrate.

10. The apparatus of claim 9 wherein the lens system is characterized by a depth of focus, the depth of focus having a precision associated therewith, the sensor being operable to measure the distance to a precision greater than the precision of the depth of focus of the lens system.

11. The apparatus of claim 1 further comprising an automated substrate handling system for loading and unloading substrates to and from the substrate stage and for retrieving and delivering substrates from and to a substrate storage area.

12. The apparatus of claim 1 wherein the reticle chuck is coupled to the stage structure via a third actuator which provides motion of the reticle chuck in the first dimension, and wherein the apparatus is operable to transfer the multiple, adjacent, non-overlapping copies of the reticle pattern onto the substrate by moving the reticle chuck in the first dimension to align the reticle pattern with adjacent fields in each of the portions of the substrate.

13. The apparatus of claim 1 wherein each of the reticle and the substrate is characterized by a length in the first dimension, the length of the reticle being greater than the length of the substrate.

14. A method for transferring a reticle pattern from a reticle onto a substrate, the reticle being held on a reticle stage and the substrate being held on a substrate stage, an illumination system and a lens system being disposed on opposite sides of and adjacent the reticle, the method comprising the steps of:

moving the lens and illumination systems in a first dimension to transfer the reticle pattern to the substrate;

providing relative motion in a second dimension between the substrate stage and reticle stage to align the reticle pattern with successive, adjacent portions of the substrate, the second dimension being orthogonal to the first dimension, one of the first dimension and the second dimension being along a single axis; and repeating the moving and providing steps a plurality of times thereby transferring multiple, adjacent, non-overlapping copies of the reticle pattern onto the substrate.

15. The apparatus of claim 1 wherein the substrate stage is supported on air bearings.

16. The apparatus of claim 1 further including an alignment actuator configured to move the reticle.

17. The apparatus of claim 1 further including an alignment actuator configured to move the substrate.

* * * * *